United States Patent
Camponeschi et al.

(10) Patent No.: US 10,868,556 B2
(45) Date of Patent: Dec. 15, 2020

(54) APPARATUS FOR CALIBRATING A TIME-INTERLEAVED ANALOG-TO-DIGITAL CONVERTER

(71) Applicant: Intel Corporation, Santa Clara, CA (US)

(72) Inventors: Matteo Camponeschi, Villach (AT); Albert Molina, Novelda (ES)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/799,958

(22) Filed: Feb. 25, 2020

(65) Prior Publication Data

US 2020/0313687 A1 Oct. 1, 2020

(30) Foreign Application Priority Data

Mar. 29, 2019 (DE) .................. 10 2019 108 175

(51) Int. Cl.
*H03M 1/10* (2006.01)
*H03M 1/12* (2006.01)

(52) U.S. Cl.
CPC ....... *H03M 1/1009* (2013.01); *H03M 1/1215* (2013.01)

(58) Field of Classification Search
CPC .......................... H03M 1/1009; H03M 1/1215
USPC ................................................. 341/120–155
See application file for complete search history.

(56) References Cited

U.S. PATENT DOCUMENTS

| | | | | |
|---|---|---|---|---|
| 8,471,751 B2* | 6/2013 | Wang | ............... | H03M 1/145 341/156 |
| 8,890,728 B2* | 11/2014 | Le Dortz | ............ | H03M 1/0624 341/118 |
| 9,143,149 B1* | 9/2015 | van Engelen | ......... | H03M 1/124 |
| 9,397,566 B2* | 7/2016 | Cowley | ............... | H02M 3/157 |
| 10,601,434 B1* | 3/2020 | Molina | ............... | H04B 1/16 |
| 10,659,072 B1* | 5/2020 | Lu | ................ | H03M 1/1033 |

(Continued)

OTHER PUBLICATIONS

Manar El-Chammas, "Background Calibration of Timing Sew in Time-Inerleaved A/D Converters", A Dissertation submitted to the Department of Electrical Engineering and the Committee on graduate Studies of Stanford University, http://purl.stanford.edu/edu/xc093xt9301, Aug. 2010.

(Continued)

*Primary Examiner* — Lam T Mai
(74) *Attorney, Agent, or Firm* — 2SPL Patent Attorneys PartG mbB; Yong Beom Hwang (57) ABSTRACT

An apparatus for calibrating a time-interleaved analog-to-digital converter including a plurality of time-interleaved analog-to-digital converter circuits is provided. The apparatus includes a clock generation circuit configured to generate a plurality of phase shifted clock signals for the plurality of time-interleaved analog-to-digital converter circuits and a reference clock signal. Further, the apparatus includes a reference signal generation circuit configured to generate a reference signal based on the reference clock signal. The reference signal is a square wave signal. The apparatus additionally includes a coupling circuit configured to controllably couple an input node of the time-interleaved analog-to-digital converter to either the reference signal generation circuit or to a signal node capable of providing an analog signal for digitization.

20 Claims, 4 Drawing Sheets

(56) References Cited

U.S. PATENT DOCUMENTS

| | | | |
|---|---|---|---|
| 10,715,165 B2* | 7/2020 | Kurahashi | H03M 1/125 |
| 10,720,936 B1* | 7/2020 | Xu | H03M 1/121 |
| 2017/0134033 A1* | 5/2017 | de Figueiredo | H03M 1/1038 |
| 2017/0237419 A1* | 8/2017 | Clara | H03M 1/06 |
| | | | 327/231 |

OTHER PUBLICATIONS

Behzad Razavi, "Design Considerations for Interleaved ADCs", IEEE Journal of Solid-State Circuits, Aug. 2013, pp. 1806-1817, vol. 48, No. 8.

* cited by examiner

APPARATUS FOR CALIBRATING A TIME-INTERLEAVED ANALOG-TO-DIGITAL CONVERTER

CROSS REFERENCE TO RELATED APPLICATIONS

This application claims priority under 35 U.S.C. § 119 to German Patent Application No. 10 2019 108 175.0, filed Mar. 29, 2019, which is incorporated by reference as if fully set forth herein.

FIELD

The present disclosure relates to analog-to-digital conversion. In particular, examples relate to an apparatus for calibrating a Time-Interleaved Analog-to-Digital Converter (TI-ADC), a receiver, a base station and a mobile device.

BACKGROUND

A TI-ADC employs several lower speed sub-ADCs operating in parallel in order to achieve a desired aggregate sampling rate. Thus, each sub-ADC may operate at a lower speed compared to when a single ADC would be used. TI-ADCs may suffer from timing skew (also known as timing mismatch), i.e. random delays in the clock phases of the individual sub-ADCs. This may cause severe performance degradation.

Hence, there may be a desire for a calibration architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
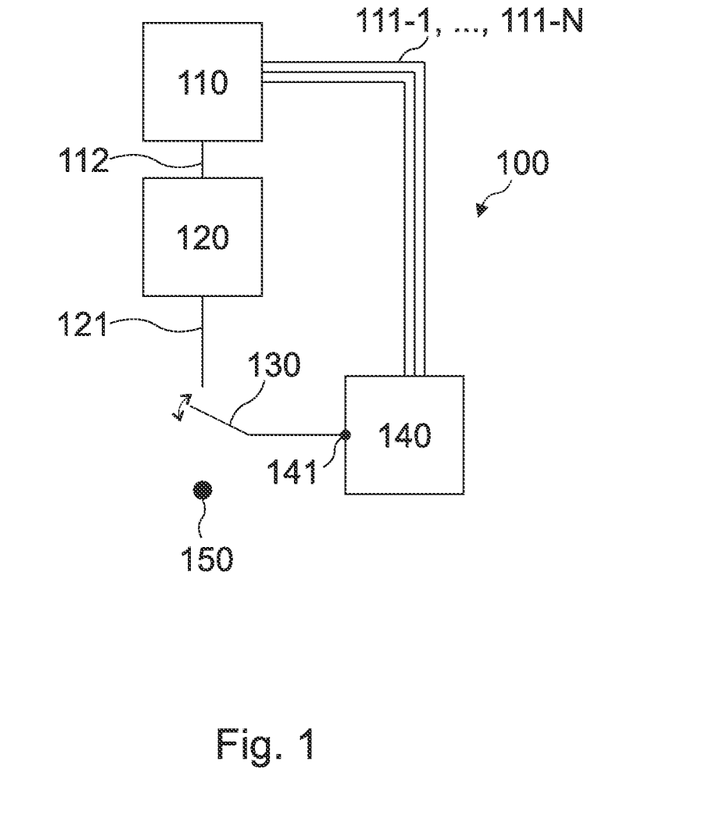
FIG. 1 illustrates an example of an apparatus for calibrating a TI-ADC.

FIG. 1 illustrates an apparatus 100 for calibrating a TI-ADC 140 comprising a plurality of time-interleaved ADC circuits. The plurality of time-interleaved ADC circuits may be any number N≥2 of time-interleaved ADC circuits (e.g. related to a desired total/aggregate sample rate of the TI-ADC 140). The time-interleaved ADC circuits of the TI-ADC 140 may be understood as ADC channels or sub-ADCs of the TI-ADC 140. An ADC circuit of the TI-ADC 140 may, e.g., be a Successive Approximation Register (SAR) ADC, a flash ADC (also referred to as direct conversion ADC), a pipeline ADC, a sigma-delta ADC or a time-interleaved ADC itself. If an ADC circuit is a time-interleaved ADC itself, it may comprise at least two sub-ADC circuits. A sub-ADC circuit may, e.g., be a SAR ADC, a flash ADC, a pipeline ADC or a sigma-delta ADC.

The apparatus 100 comprises a clock generation circuit 110 configured to generate a plurality of phase shifted clock signals 111-1, . . . , 111-N for the plurality of time-interleaved ADC circuits. The plurality of time-interleaved ADC circuits sample a signal input to the TI-ADC 140 based on the plurality of phase shifted clock signals 111-1, . . . , 111-N. For example, each of the plurality of time-interleaved ADC circuits may sample the signal input to the TI-ADC 140 using a different one of the plurality of phase shifted clock signals 111-1, . . . , 111-N. Further, the clock generation circuit 110 is configured to generate a reference clock signal 112 for calibration. For example, the reference clock signal 112 and the plurality of phase shifted clock signals 111-1, . . . , 111-N may be square wave signals. However, it is to be noted that square wave signals are merely exemplary and do not restrict the proposed architecture.

The apparatus 100 further comprises a reference signal generation circuit 120 coupled to the clock generation circuit 110. The reference signal generation circuit 120 is configured to generate a reference signal 121 for calibrating the TI-ADC 140 based on the reference clock signal 112. The reference signal 121 is a square wave signal. The reference signal generation circuit 120 may be any electronic circuit capable of generating a square wave signal as reference signal 121 based on the reference clock signal 112. For example, the reference signal generation circuit 120 may be a Digital-to-Analog Converter (DAC) or a Phase-Locked Loop (PLL).

Additionally, the apparatus 100 comprises a coupling circuit 130 configured to controllably couple an input node 141 of the TI-ADC 140 to either the reference signal generation circuit 120 or to a signal node 150 capable of providing an analog signal for digitization. For example, the coupling circuit 150 may be configured to controllably couple the input node 141 of the TI-ADC 140 to either the reference signal generation circuit 120 or to the signal node 150 based on a control signal indicative of a desired operation mode of the TI-ADC 140. If the TI-ADC 140 is to be calibrated (i.e. the TI-ADC 140 operates in a calibration mode), the coupling circuit 130 may couple the input node 141 of the TI-ADC 140 to the reference signal generation circuit 120 so that the reference signal 121 is supplied as input to the TI-ADC 140. On the other hand, if the TI-ADC 140 is to digitize an analog signal such as an analog RF signal carrying user data (i.e. the TI-ADC 140 operates in a regular/normal operation mode), the coupling circuit 130 may couple the input node 141 of the TI-ADC 140 to the signal node 150 so that the analog signal is supplied as input to the TI-ADC 140. For example, the coupling circuit 130 may be implemented using one or more switches (e.g. analog switches such as MOS transistors) or one or more (programmable) attenuators (e.g. attenuating the reference signal 121 if the TI-ADC 140 is to digitize an analog signal provided by the signal node 150, and vice versa).

The apparatus 100 may allow selective offline calibration of the TI-ADC 140 by selective coupling the input of the TI-ADC 140 to either the reference signal generation circuit 120 or to the signal node 150. Further, the square wave reference signal 121 may allow to calibrate a timing skew of the TI-ADC 140 as will be described below in detail with reference to FIGS. 2 and 3.

Figure 2:
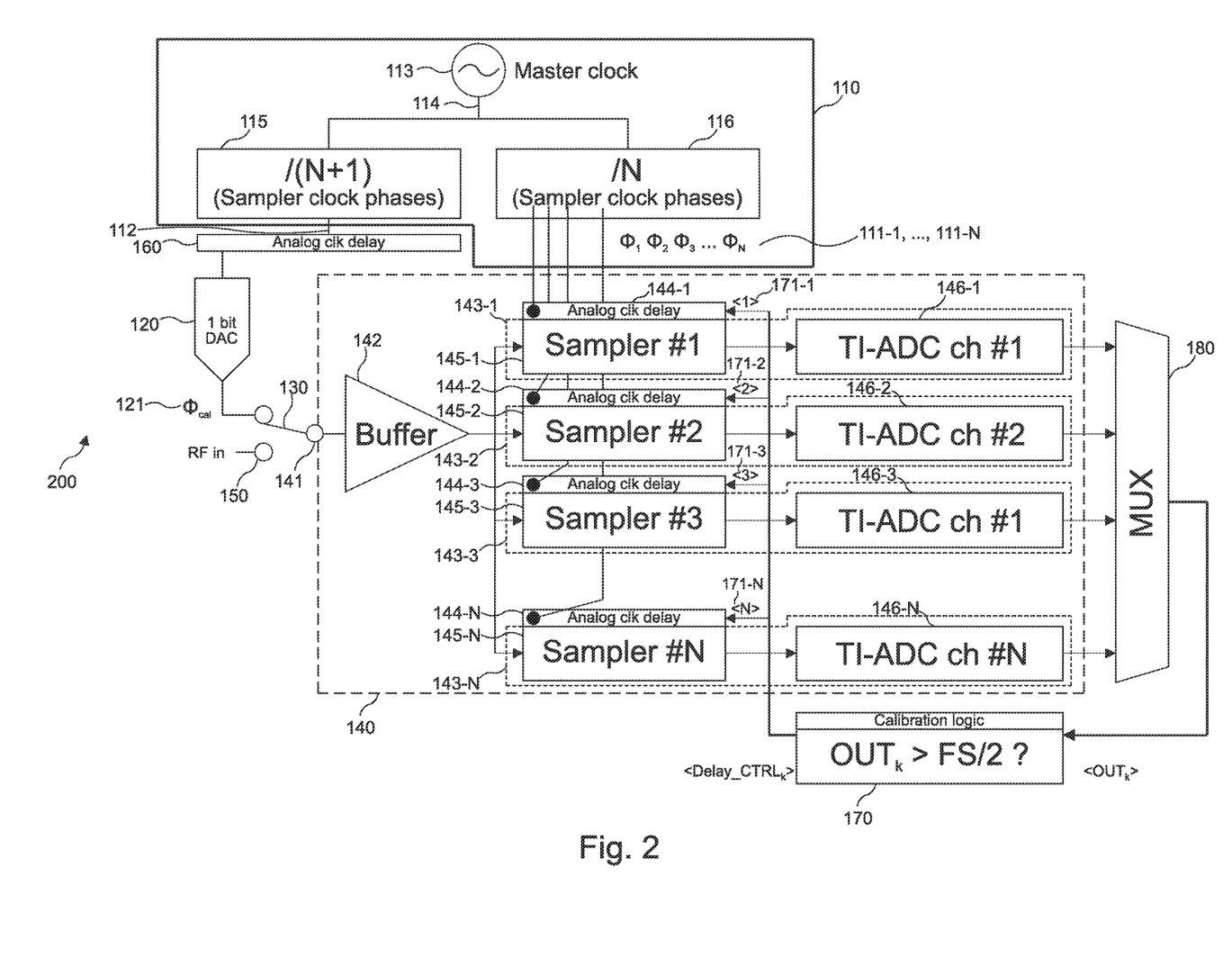
FIG. 2 illustrates another example of an apparatus for calibrating a TI-ADC.

FIG. 2 illustrates a more detailed example of an apparatus 200 for calibrating the TI-ADC 140. In FIG. 2, also the TI-ADC 140 is illustrated in detail.

The TI-ADC 140 comprises the input node 141 that is configured to receive an analog input signal for the TI-ADC 140. Similar to what is described above, the input node 141 may either be coupled to the signal node 150 capable of providing an analog signal for digitization (e.g. an RF receive signal) or to the reference signal generation circuit 120 of the apparatus 200 by means of coupling circuit 130. In the example of FIG. 2, the coupling circuit 130 is implemented as a switch.

The plurality of time-interleaved ADC circuits 143-1, ..., 143-N are coupled to the input node 141 via an input buffer 142. The individual ADC circuits 143-1, ..., 143-N are merely illustrated schematically in FIG. 2 by means of a respective sample circuit 145-1, ..., 145-N for sampling the analog input signal provided by the input buffer 142, and a respective conversion circuit 146-1, ..., 146-N for processing the samples generated by the respective sample circuit 145-1, ..., 145-N of the individual ADC circuit 143-1, ..., 143-N. For example, if one of the ADC circuits 143-1, ..., 143-N is implemented as a SAR ADC, the respective conversion circuit 146-1, ..., 146-N represents the SAR, the DAC, the comparator etc. of the SAR ADC.

Further illustrated is the clock generation circuit 110 of the apparatus 200. The clock generation circuit 110 comprises an oscillator 113 configured to generate an oscillation signal 114 (which may be understood as a master clock). In alternative examples, the oscillator 113 may be replaced by an input node configured to receive the oscillation signal 114 from an external signal source.

Further, the clock generation circuit 110 comprises a first frequency divider circuit 115 configured to frequency divide the oscillation signal 114 by a first divider value for generating the reference clock signal 112. Additionally, the clock generation circuit 110 comprises a second frequency divider circuit 116 configured to frequency divide the oscillation signal 114 by a second divider value for generating the plurality of phase shifted clock signals 111-1, ..., 111-N (exhibiting different phases $\Phi_1, \ldots, \Phi_N$). The number of phase shifted clock signals 111-1, ..., 111-N may be equal to the number of time-interleaved ADC circuits 143-1, ..., 143-N. As can be seen from the example of FIG. 2, the clock phases $\Phi_1, \ldots, \Phi_N$ for the plurality of time-interleaved ADC circuits 143-1, ..., 143-N and the reference signal generation circuit 120 are derived from a master clock so that no clock drift occurs.

The first divider value is different from the second divider value so that the reference clock signal 112 exhibits a different frequency than the plurality of phase shifted clock signals 111-1, ..., 111-N. For example, the first divider value and the second divider value may be selected such that they have no common divider. In other words, the first divider value and the second divider value may be in a relative prime relationship. For example, the first divider value may be N+1 or N−1, and the second divider value may be N. In the example of FIG. 2, the first divider value may is N+1 and the second divider value is N.

The apparatus 200 additionally comprises a (analog) delay circuit 160 coupled between the clock generation circuit 110 and the reference signal generation circuit 120. The delay circuit 160 is configured to selectively delay the reference clock signal 112 for timely aligning signal edges of the reference signal 112 to signal edges of the plurality of phase shifted clock signals 111-1, ..., 111-N. The delay circuit 160 may enable a coarse alignment of the clock signal 112 to each of the phase shifted clock signals 111-1, ..., 111-N (i.e. to each phase of the sampler clocks). It is to be noted that the delay circuit 160 may alternatively be located between the oscillator 113 and the first frequency divider circuit 115, or between the signal generation circuit 120 and the coupling circuit 130.

As described above, the delay circuit 160 may provide a coarse alignment of the clock signal 112 to each of the plurality of phase shifted clock signals 111-1, ..., 111-N. For a fine alignment of the clock signal 112 to each of the plurality of phase shifted clock signals 111-1, ..., 111-N, the delay circuits 144-1, ..., 144-N of the TI-ADC 140 are used. Each delay circuit 144-1, ..., 144-N of the TI-ADC 140 delays one of the plurality of phase shifted clock signals 111-1, ..., 111-N prior to supplying it to an associated one of the plurality of time-interleaved ADC circuits 143-1, ..., 143-N. For example, the delay circuit 144-1 delays the clock signal 111-1 prior to supplying it to the ADC circuit 143-1. Accordingly, the sample circuit 145-1 of the ADC circuit 143-1 samples the analog signal provided by the input buffer 142 based on the clock signal 111-1.

Since the delay circuit 160 for delaying the reference clock signal 112 is to provide a coarse alignment, a time resolution of the delay circuit 160 is lower than a time resolution of any of the delay circuits 144-1, ..., 144-N for delaying a respective one of the plurality of phase shifted clock signals 111-1, ..., 111-N. Further, a maximum applicable time delay of the delay circuit 160 is greater than a maximum applicable time delay of any of the delay circuits 144-1, . . . , 144-N for delaying a respective one of the plurality of phase shifted clock signals 111-1, . . . , 111-N.

In some example, the delay circuit 160 may be omitted. For example, if the delay circuits 144-1, . . . , 144-N of the TI-ADC 140 provide a sufficient range for delaying the plurality of phase shifted clock signals 111-1, . . . , 111-N (i.e. if the delay circuits 144-1, . . . , 144-N provide a sufficient maximum applicable time delay).

After delaying, the delay circuit 160 outputs the reference signal 112 to the reference signal generation circuit 120. In the example of FIG. 2, the reference signal generation circuit 120 is implemented as a DAC exhibiting a resolution of 1 bit due to the inherent linearity of the 1 bit DAC. For example, the 1 bit DAC may be implemented as a switch such as a double throw switch between a (first node at a) first potential (e.g. a supply voltage $V_{dd}$) and a (second node at a) second potential (e.g. ground or a supply voltage $V_{ss}$). However, as indicated above, the proposed architecture is not limited to using a one bit DAC for the reference signal generation circuit 120. In other examples, a DAC exhibiting a higher resolution (e.g. two bit) or a PLL may be used for the reference signal generation circuit 120. Based on the reference signal 112, the reference signal generation circuit 120 generates/outputs the reference signal 121 exhibiting a square wave signal shape.

The square wave reference signal 121 may allow an offline timing-mismatch calibration of the TI-ADC 140. For calibration, the coupling circuit 130 disconnects the TI-ADC 140 from the signal node 150 and couples the TI-ADC 140 to the reference signal generation circuit 120 so that the reference signal 121 is injected into the TI-ADC 140. In the proposed calibration scheme, the plurality of time-interleaved ADC circuits 143-1, . . . , 143-N are used as comparators for detecting the rising or falling signal edges of the plurality of phase shifted clock signals 111-1, . . . , 111-N.

Figure 3:
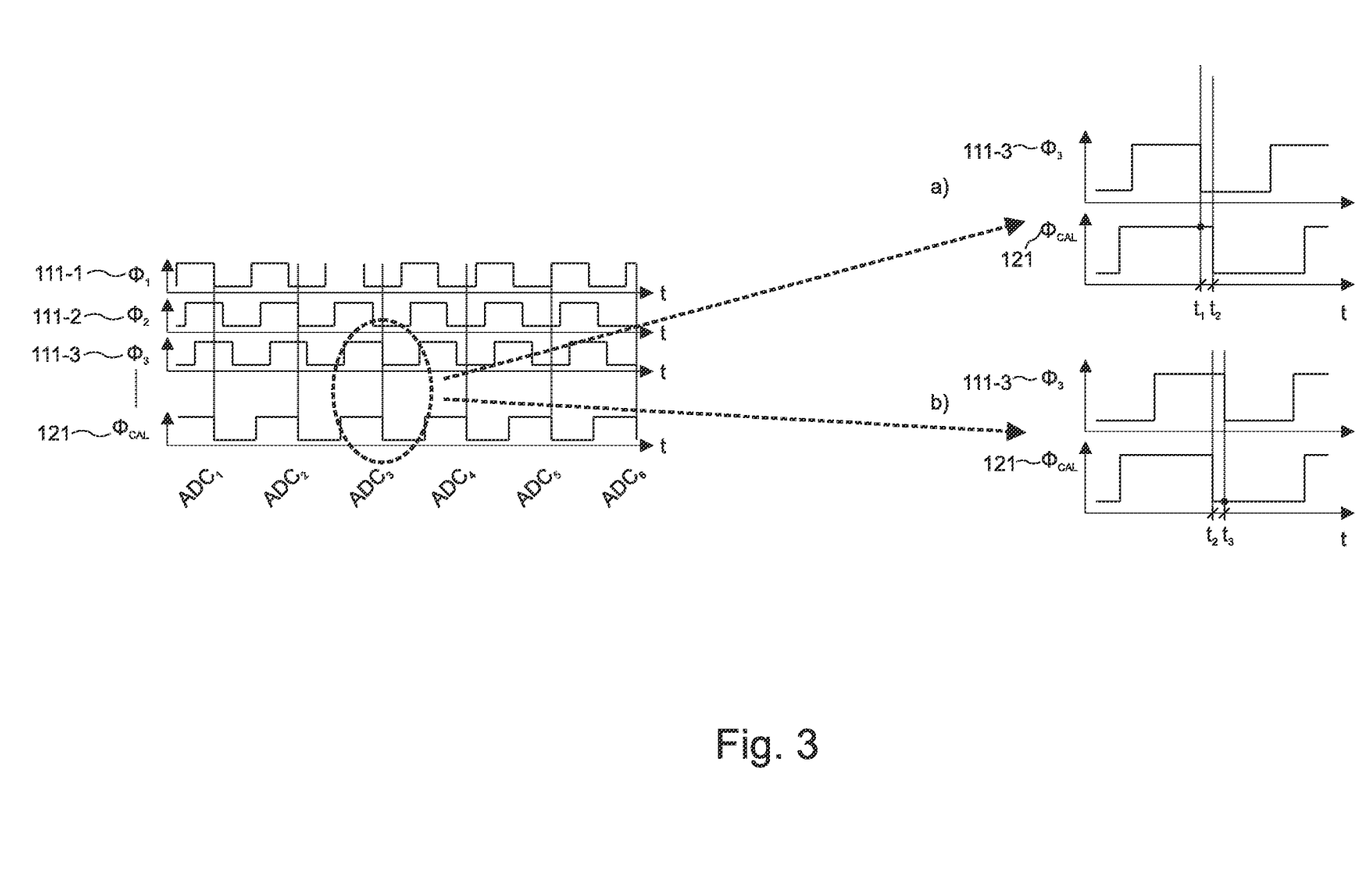
FIG. 3 illustrates an exemplary comparison of phase shifted clock signals and a reference clock signal.

The phase relation between the plurality of phase shifted clock signals 111-1, . . . , 111-N and the reference signal 121 is illustrated in FIG. 3. Due to the ratio of the divider values for the first and second frequency divider circuits 115 and 116, the oscillation period $T_{CAL}$ of the reference signal 121 and the oscillation period $T_K$ of the phase shifted clock signals 111-1, . . . , 111-N have the following relationship:

$$T_{CAL}=(N+1)/N \cdot T_K \qquad (1)$$

Accordingly, the reference signal 121 periodically cycles over all sampling edges of the phase shifted clock signals 111-1, . . . , 111-N. For example, in FIG. 3, falling signal edges of the reference signal 121 are for succeeding oscillation periods of the reference signal 121 aligned to first a falling signal edge of the clock signal 111-1, then a falling signal edge of the clock signal 111-2, then a falling signal edge of the clock signal 111-3, and so on. Therefore, delays of individual ones of the plurality of phase shifted clock signals 111-1, . . . , 111-N may be determined using the reference signal 121 and the plurality of time-interleaved ADC circuits 143-1, . . . , 143-N. No extra hardware is required.

This is further illustrated in the right part of FIG. 3 for the clock signal 111-3, which illustrates two possible states a) and b) that may occur. In state a), the clock signal 111-3 is earlier than the reference signal 121. In state b), the clock signal 111-3 is later than the reference signal 121.

In state a), the ADC circuit 141-3 samples the reference signal 121 based on the clock signal 111-3 at a time instant $t_1$. Since the clock signal 111-3 is early, the reference signal 121 is sampled while it exhibits a high signal level. The reference signal 121 only goes down to a low signal level at a later time instant $t_2$. Accordingly, the ADC circuit 141-3 generates a digital output value that indicates the high signal level.

In state b), the ADC circuit 141-3 samples the reference signal 121 based on the clock signal 111-3 at a time instant $t_3$. Since the clock signal 111-3 is late, the reference signal 121 is sampled while it exhibits a low signal level. The reference signal 121 already went down from the high signal level to the low signal level at the earlier time instant $t_2$. Accordingly, the ADC circuit 141-3 generates a digital output value that indicates the low signal level.

The fact that only the two states a) and b) are possible may be used by the processing circuit 170 for calibrating the TI-ADC 140. In particular, the delay time of the delay circuit 144-3 may be adjusted based on the digital output value of the ADC circuit 141-3. The processing circuit 170 is configured to compare the digital output value of the ADC circuit 141-3 to a threshold value for obtaining a comparison result. For example, the threshold value may be half of the full scale value of the ADC circuit 141-3. The full scale value of the ADC circuit 141-3 is maximum digital value that can be represented by the output of the ADC circuit 141-3 (i.e. the output value of the ADC circuit 141-3 for a high input signal). Accordingly, if the clock signal 111-3 is early, the digital output value of the ADC circuit 141-3 is higher than half of the full scale value of the ADC circuit 141-3. Similarly, if the clock signal 111-3 is late, the digital output value of the ADC circuit 141-3 is lower than half of the full scale value of the ADC circuit 141-3. Based on the comparison result, the delay time of the delay circuit 144-3 may be increased or decreased. Therefore, the processing circuit 170 is further configured to generate a control signal 171-3 for adjusting a delay time of the delay circuit 144-3 for delaying the clock signal 111-3. For example, if the threshold value is smaller than the digital output value of the ADC circuit 141-3, the processing circuit 170 may be configured to generate the control signal 171-3 such that the delay time of the delay circuit 144-3 for delaying the clock signal 111-3 is increased. Similarly, if the digital output value of the ADC circuit 141-3 is smaller than the threshold value, the processing circuit 170 may be configured to generate the control signal 171-3 such that the delay time of the delay circuit 144-3 for delaying the clock signal 111-3 is decreased. This procedure may be iterated until the clock-delay error is minimized for the ADC circuit 141-3.

The same procedure may be applied for the other ADC circuits 141-1, 141-2, etc. That is, control signals 171-1, 171-2, etc. for adjusting delay time of the delay circuit 144-1, 144-2, etc. may be generated by the processing circuit 170 based on a comparison of the digital output value of the associated ADC circuit 141-1, 141-2, etc. to the threshold value.

In other words, the processing circuit 170 is configured to compare a first digital output value of a first one of the plurality of time-interleaved ADC circuits 143-1, . . . , 143-N to a threshold value for obtaining a first comparison result. The first digital output value is generated by the first one of the plurality of time-interleaved ADC circuits 143-1, . . . , 143-N by sampling the reference signal based on a first one of the plurality of phase shifted clock signals 111-1, . . . , 111-N supplied to the first one of the plurality of time-interleaved ADC circuits 143-1, . . . , 143-N by a first one of the plurality of delay circuits 144-1, . . . , 144-N. Further, the processing circuit 170 is configured to compare a second digital output value of a (different) second one of the plurality of time-interleaved ADC circuits 143-1, . . . , 143-N to the threshold value for obtaining a second comparison result. The second digital output value is generated by the second one of the plurality of time-interleaved ADC circuits 143-1, . . . , 143-N by sampling the reference signal based on a (different) second one of the plurality of phase shifted clock signals 111-1, . . . , 111-N supplied to the second one of the plurality of time-interleaved ADC circuits 143-1, . . . , 143-N by a (different) second one of the plurality of delay circuits 144-1, . . . , 144-N. Further, the processing circuit 170 is configured to generate, based on the first comparison result, a first control signal for adjusting a delay time of the first delay circuit for delaying the first one of the plurality of phase shifted clock signals 111-1, . . . , 111-N. Additionally, the processing circuit 170 is configured to generate, based on the second comparison result, a second control signal for adjusting a delay time of the second delay circuit for delaying the second one of the plurality of phase shifted clock signals 111-1, . . . , 111-N independently from the delay time adjustment of the other delay circuits of the plurality of delay circuits 144-1, . . . , 144-N.

In order to be able to calibrate one ADC circuit at a time, a multiplexer 180 is coupled between the TI-ADC 140 and the processing circuit 170. The processing circuit 170, which may be understood as a calibration logic, may use a simple comparison as described above for providing a positive or negative calibration value. In other examples, the processing circuit 170 may be configured to average over time in terms of acquisition for reducing noise, or be configured to use hysteresis in terms of values for avoiding extra toggling when close to the threshold.

Hence, the proposed calibration scheme may allow to adjust the clock delay for each of the plurality of phase shifted clock signals 111-1, . . . , 111-N, i.e. each of the time-interleaved ADC circuits 143-1, . . . , 143-N individually (i.e. independently from the other ADC circuits 143-1, . . . , 143-N).

In other words, the proposed architecture may enable to correct timing mismatch in the digital domain by detecting the crossing of a threshold level for each ADC circuit output and by using this information for aligning the respective ADC clock. In some examples, the proposed architecture may only require a 1 bit DAC in addition to the uncalibrated TI-ADC since each sub-ADC of the TI-ADC may be used as a comparator for detecting the rising or falling edge of the associated clock signal. Hence, no extra hardware such as an additional ADC reference channel is needed.

Figure 4:
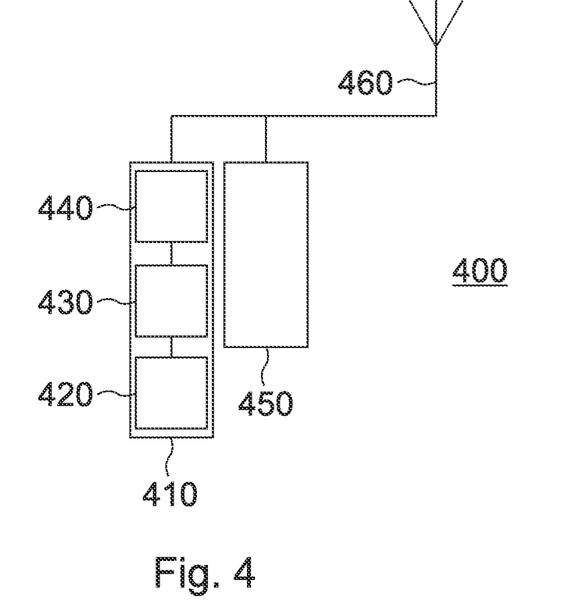
FIG. 4 illustrates an example of a base station.

An example of an implementation using TI-ADC calibration according to one or more aspects of the architectures described above or one or more examples described above is illustrated in FIG. 4. FIG. 4 schematically illustrates an example of a radio base station 400 (e.g. for a femtocell, a picocell, a microcell or a macrocell) comprising an apparatus 430 for calibrating a TI-ADC 420 as proposed.

The TI-ADC 420 and the apparatus 430 for calibrating the TI-ADC 420 are part of a receiver 410. The receiver 410 additionally comprises analog circuitry 440 configured to receive a RF receive signal from an antenna element 460 of the base station 400. The analog circuitry 440 is further configured to supply the analog signal for digitization to the signal node of the apparatus 430 based on the RF receive signal. For example, the analog circuitry 440 may comprise one or more of a filter, a down-converter (mixer) or a Low Noise Amplifier (LNA).

Further, the base station 400 comprises a transmitter 450 configured to generate a RF transmit signal. The transmitter 450 may use the antenna element 460 or another antenna element (not illustrated) of the base station 400 for radiating the RF transmit signal to the environment.

To this end, a base station enabling improved offline calibration of the TI-ADC may be provided. Accordingly, a performance of the TI-ADC and, hence, the base station may be improved.

The base station 400 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 5:
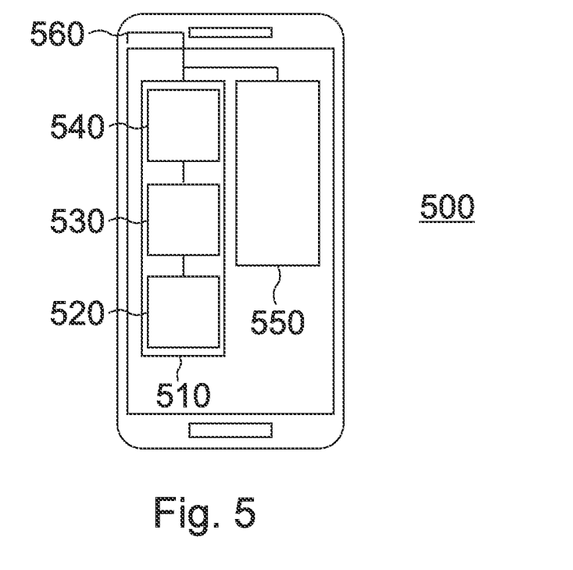
FIG. 5 illustrates an example of a mobile device.

Another example of an implementation using TI-ADC calibration according to one or more aspects of the architecture(s) described above or one or more examples described above is illustrated in FIG. 5. FIG. 5 schematically illustrates an example of a mobile device 500 (e.g. mobile phone, smartphone, tablet-computer, or laptop) comprising an apparatus 530 for calibrating a TI-ADC 520 as proposed.

The TI-ADC 520 and the apparatus 530 for calibrating the TI-ADC 520 are part of a receiver 510. The receiver 510 additionally comprises analog circuitry 540 configured to receive a RF receive signal from an antenna element 560 of the mobile device 500. The analog circuitry 540 is further configured to supply the analog signal for digitization to the signal node of the apparatus 530 based on the RF receive signal. For example, the analog circuitry 540 may comprise one or more of a filter, a down-converter (mixer) or a LNA.

Further, the mobile device 500 comprises a transmitter 550 configured to generate a RF transmit signal. The transmitter 550 may use the antenna element 560 or another antenna element (not illustrated) of the mobile device 500 for radiating the RF transmit signal to the environment.

To this end, a mobile device enabling improved offline calibration of the TI-ADC may be provided. Accordingly, a performance of the TI-ADC and, hence, the mobile device may be improved.

The mobile device 500 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (JO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using TI-ADC calibration according to the proposed architecture or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is an apparatus for calibrating a TI-ADC comprising a plurality of time-interleaved ADC circuits, the apparatus comprising: a clock generation circuit configured to generate a plurality of phase shifted clock signals for the plurality of time-interleaved ADC circuits and a reference clock signal; a reference signal generation circuit configured to generate a reference signal based on the reference clock signal, wherein the reference signal is a square wave signal; and a coupling circuit configured to controllably couple an input node of the time-interleaved ADC to either the reference signal generation circuit or to a signal node capable of providing an analog signal for digitization.

Example 2 is the apparatus of example 1, wherein the coupling circuit is configured to controllably couple the input node of the time-interleaved ADC to either the reference signal generation circuit or to the signal node based on a control signal indicative of a desired operation mode of the TI-ADC.

Example 3 is the apparatus of example 1 or example 2, wherein the clock generation circuit comprises: an oscillator configured to generate an oscillation signal; a first frequency divider circuit configured to frequency divide the oscillation signal by a first divider value for generating the reference clock signal; and a second frequency divider circuit configured to frequency divide the oscillation signal by a second divider value for generating the plurality of phase shifted clock signals.

Example 4 is the apparatus of example 1 or example 2, wherein the clock generation circuit comprises: an input node configured to receive an oscillation signal; a first frequency divider circuit configured to frequency divide the oscillation signal by a first divider value for generating the reference clock signal; and a second frequency divider circuit configured to frequency divide the oscillation signal by a second divider value for generating the plurality of phase shifted clock signals.

Example 5 is the apparatus of example 3 or example 4, wherein the first divider value and the second divider value have no common divider.

Example 6 is the apparatus of any of example 3 to 5, wherein the first divider value is N+1 or N−1, and wherein the second divider value is N.

Example 7 is the apparatus of any of examples 1 to 6, wherein the reference signal generation circuit is a phase-locked loop configured to receive the reference clock signal as input.

Example 8 is the apparatus of any of examples 1 to 6, wherein the reference signal generation circuit is a digital-to-analog converter configured to receive the reference clock signal as input.

Example 9 is the apparatus of example 8, wherein a resolution of the digital-to-analog converter is one bit.

Example 10 is the apparatus of any of examples 1 to 9, further comprising a delay circuit coupled between the clock generation circuit and the reference signal generation circuit, wherein the delay circuit is configured to selectively delay the reference clock signal for timely aligning signal edges of the reference signal to signal edges of the plurality of phase shifted clock signals.

Example 11 is the apparatus of example 10, wherein the TI-ADC comprises a delay circuit for delaying one of the plurality of phase shifted clock signals prior to supplying it to one of the plurality of time-interleaved ADC circuits, and wherein a time resolution of the delay circuit for delaying the reference clock signal is lower than a time resolution of the delay circuit for delaying the one of the plurality of phase shifted clock signals.

Example 12 is the apparatus of example 10 or example 11, wherein the TI-ADC comprises a delay circuit for delaying one of the plurality of phase shifted clock signals prior to supplying it to one of the plurality of time-interleaved ADC circuits, and wherein a maximum applicable time delay of the delay circuit for delaying the reference clock signal is greater than a maximum applicable time delay of the delay circuit for delaying the one of the plurality of phase shifted clock signals.

Example 13 is the apparatus of any of examples 1 to 12, wherein the TI-ADC comprises a delay circuit for delaying one of the plurality of phase shifted clock signals prior to supplying it to one of the plurality of time-interleaved ADC circuits, and wherein the apparatus further comprises a processing circuit configured to: compare a digital output value of the one of the plurality of time-interleaved ADC circuits to a threshold value for obtaining a comparison result, wherein the digital output value is generated by the one of the plurality of time-interleaved ADC circuits by sampling the reference signal based on the one of the plurality of phase shifted clock signals; and generate, based on the comparison result, a control signal for adjusting a delay time of the delay circuit for delaying the one of the plurality of phase shifted clock signals.

Example 14 is the apparatus of example 13, wherein the threshold value is half of the full scale value of the one of the plurality of time-interleaved ADC circuits.

Example 15 is the apparatus of example 13 or example 14, wherein, if the threshold value is smaller than the digital output value, the processing circuit is configured to generate the control signal such that the delay time of the delay circuit for delaying the one of the plurality of phase shifted clock signals is increased.

Example 16 is the apparatus of any of examples 13 to 15, wherein, if the digital output value is smaller than the threshold value, the processing circuit is configured to generate the control signal such that the delay time of the delay circuit for delaying the one of the plurality of phase shifted clock signals is decreased.

Example 17 is the apparatus of any of examples 1 to 16, wherein the reference clock signal and the plurality of phase shifted clock signals are square wave signals.

Example 18 is a receiver, comprising: a TI-ADC; and an apparatus for calibrating the TI-ADC according to any of examples 1 to 17.

Example 19 is the receiver of example 18, further comprising analog circuitry configured to receive a RF receive signal from an antenna element, and to supply the analog signal for digitization to the signal node based on the RF receive signal.

Example 20 is a base station, comprising: a receiver according to example 18 or example 19; and a transmitter configured to generate a RF transmit signal.

Example 21 is the base station of example 20, further comprising at least one antenna element coupled to at least one of the receiver and the transmitter.

Example 22 is a mobile device, comprising: a receiver according to example 18 or example 19; and a transmitter configured to generate a RF transmit signal.

Example 23 is the mobile device of example 22, further comprising at least one antenna element coupled to at least one of the receiver and the transmitter.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or—steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for calibrating a time-interleaved analog-to-digital converter comprising a plurality of time-interleaved analog-to-digital converter circuits, the apparatus comprising:
    a clock generation circuit configured to generate a plurality of phase shifted clock signals for the plurality of time-interleaved analog-to-digital converter circuits and a reference clock signal;
    a reference signal generation circuit configured to generate a reference signal based on the reference clock signal, wherein the reference signal is a square wave signal; and
    a coupling circuit configured to controllably couple an input node of the time-interleaved analog-to-digital converter to either the reference signal generation circuit or to a signal node capable of providing an analog signal for digitization.

2. The apparatus of claim 1, wherein the coupling circuit is configured to controllably couple the input node of the time-interleaved analog-to-digital converter to either the reference signal generation circuit or to the signal node based on a control signal indicative of a desired operation mode of the time-interleaved analog-to-digital converter.

3. The apparatus of claim 1, wherein the clock generation circuit comprises:
    an oscillator configured to generate an oscillation signal;
    a first frequency divider circuit configured to frequency divide the oscillation signal by a first divider value for generating the reference clock signal; and
    a second frequency divider circuit configured to frequency divide the oscillation signal by a second divider value for generating the plurality of phase shifted clock signals.

4. The apparatus of claim 1, wherein the clock generation circuit comprises:
    an input node configured to receive an oscillation signal;
    a first frequency divider circuit configured to frequency divide the oscillation signal by a first divider value for generating the reference clock signal; and
    a second frequency divider circuit configured to frequency divide the oscillation signal by a second divider value for generating the plurality of phase shifted clock signals.

5. The apparatus of claim 3, wherein the first divider value and the second divider value have no common divider.

6. The apparatus of claim 3, wherein the first divider value is N+1 or N−1, and wherein the second divider value is N.

7. The apparatus of claim 1, wherein the reference signal generation circuit is a phase-locked loop configured to receive the reference clock signal as input.

8. The apparatus of claim 1, wherein the reference signal generation circuit is a digital-to-analog converter configured to receive the reference clock signal as input.

9. The apparatus of claim 8, wherein a resolution of the digital-to-analog converter is one bit.

10. The apparatus of claim 1, further comprising a delay circuit coupled between the clock generation circuit and the reference signal generation circuit, wherein the delay circuit is configured to selectively delay the reference clock signal for timely aligning signal edges of the reference signal to signal edges of the plurality of phase shifted clock signals.

11. The apparatus of claim 10, wherein the time-interleaved analog-to-digital converter comprises a delay circuit for delaying one of the plurality of phase shifted clock signals prior to supplying it to one of the plurality of time-interleaved analog-to-digital converter circuits, and wherein a time resolution of the delay circuit for delaying the reference clock signal is lower than a time resolution of the delay circuit for delaying the one of the plurality of phase shifted clock signals.

12. The apparatus of claim 10, wherein the time-interleaved analog-to-digital converter comprises a delay circuit for delaying one of the plurality of phase shifted clock signals prior to supplying it to one of the plurality of time-interleaved analog-to-digital converter circuits, and wherein a maximum applicable time delay of the delay circuit for delaying the reference clock signal is greater than a maximum applicable time delay of the delay circuit for delaying the one of the plurality of phase shifted clock signals.

13. The apparatus of claim 1, wherein the time-interleaved analog-to-digital converter comprises a delay circuit for delaying one of the plurality of phase shifted clock signals prior to supplying it to one of the plurality of time-interleaved analog-to-digital converter circuits, and wherein the apparatus further comprises a processing circuit configured to:
    compare a digital output value of the one of the plurality of time-interleaved analog-to-digital converter circuits to a threshold value for obtaining a comparison result, wherein the digital output value is generated by the one of the plurality of time-interleaved analog-to-digital converter circuits by sampling the reference signal based on the one of the plurality of phase shifted clock signals; and generate, based on the comparison result, a control signal for adjusting a delay time of the delay circuit for delaying the one of the plurality of phase shifted clock signals.

14. The apparatus of claim 13, wherein the threshold value is half of the full scale value of the one of the plurality of time-interleaved analog-to-digital converter circuits.

15. The apparatus of claim 13, wherein, if the threshold value is smaller than the digital output value, the processing circuit is configured to generate the control signal such that the delay time of the delay circuit for delaying the one of the plurality of phase shifted clock signals is increased.

16. The apparatus of claim 13, wherein, if the digital output value is smaller than the threshold value, the processing circuit is configured to generate the control signal such that the delay time of the delay circuit for delaying the one of the plurality of phase shifted clock signals is decreased.

17. The apparatus of claim 1, wherein the reference clock signal and the plurality of phase shifted clock signals are square wave signals.

18. A receiver, comprising:
 a time-interleaved analog-to-digital converter; and
 an apparatus for calibrating the time-interleaved analog-to-digital converter according to claim 1.

19. The receiver of claim 18, further comprising analog circuitry configured to receive a radio frequency receive signal from an antenna element, and to supply the analog signal for digitization to the signal node based on the radio frequency receive signal.

20. A base station, comprising:
 a receiver according to claim 18; and
 a transmitter configured to generate a radio frequency transmit signal.

* * * * *